United States Patent [19]

Lee

[11] Patent Number: 5,416,485
[45] Date of Patent: May 16, 1995

[54] ANALOG-TO-DIGITAL CONVERSION CIRCUIT WITH IMPROVED DIFFERENTIAL LINEARITY

[76] Inventor: Hae-Seung Lee, 1 Watermill Pl., Apt. 215, Arlington, Mass. 02174

[21] Appl. No.: 170,040

[22] Filed: Dec. 20, 1993

[51] Int. Cl.$^6$ ............................................. H03M 1/44
[52] U.S. Cl. .................................... 341/172; 341/162
[58] Field of Search ............... 341/172, 156, 145, 162, 341/161, 155, 144

[56] References Cited

U.S. PATENT DOCUMENTS

| | | | |
|---|---|---|---|
| 4,611,196 | 9/1986 | Fernandez | 340/347 |
| 4,622,536 | 11/1986 | Shih et al. | 340/347 |
| 4,760,376 | 7/1988 | Kobayashi et al. | 340/347 |
| 4,894,656 | 1/1990 | Hwang et al. | 341/120 |
| 4,903,026 | 2/1990 | Tiemann et al. | 341/131 |
| 5,012,247 | 4/1991 | Dillman | 341/172 |
| 5,027,116 | 6/1991 | Armstrong et al. | 341/120 |
| 5,047,772 | 9/1991 | Ribner | 341/156 |
| 5,184,130 | 2/1993 | Mangelsdorf | 341/156 |
| 5,210,537 | 5/1993 | Mangelsdorf | 341/156 |
| 5,212,486 | 5/1993 | Nagaraj | 341/172 |

OTHER PUBLICATIONS

"An Algorithmic Analog-to-Digital Converter", by R. H. McCharles et al., IEEE International Solid-State Circuits Conference, Digest of Technical Papers, (1977), pp. 96–97.

"A Pipelined 5-Msample/s 9-bit Analog-to-Digital Converter", by S. H. Lewis et al., IEEE Journal of Solid-State Circuits, vol. SC-22, Dec. 1987, pp. 954–961.

Primary Examiner—Sharon D. Logan

[57] ABSTRACT

An analog-to-digital converter having at least one stage, each stage comprising an array of capacitors, one or more comparators, an operational amplifier, and switches. Each stage operates in two phases, the sampling phase and the amplifying phase. During the sampling phase, the input voltage is sampled on the capacitor array. During the amplifying phase, one plate of each capacitors is connected to the reference voltage, ground, or the output of the operational amplifier to produce a residue voltage. Each of the array is sequentially connected to the output of the operational amplifier as the input voltage increases. The resulting residue drop for each digital code increase is precisely equal to the full-scale voltage. Combined with over-range and digital error-correction, the resulting A/D converter exhibits excellent differential linearity.

20 Claims, 7 Drawing Sheets

ANALOG-TO-DIGITAL CONVERSION CIRCUIT WITH IMPROVED DIFFERENTIAL LINEARITY

Background of Invention

1. Field of Invention

The present invention relates to analog-to-digital converters, pipelined or non-pipelined. In particular, it is related to high resolution and high sampling rate analog-to-digital converters.

2. Description of the Prior Art

In recent years, there have been rapid advances in digital signal processing technologies which are widely being employed in audio, video, and communication signal processing, among others. Since the real-world signals are analog signals, the analog-to-digital (A/D) and the digital-to-analog (D/A) converters are indispensable parts of any system employing digital signal processing. Combined with the increasing trend toward portable systems, there is a strong demand for A/D and D/A converters with high resolution, high speed, and low power consumption. The majority of the systems that utilize such A/D and D/A converters are consumer product with extremely slim profit margins. Therefore, reducing the production cost of A/D and D/A converters is of very high priority. For this reason, high cost production technologies as well as circuit complexity must be avoided. In multi-stage A/D converters, each stage produces a small number of bits (typically between 1 and 4), and arranged to produce analog "residue" voltage. The residue is passed to the next stage as an input to that stage. In a one-stage cyclic A/D converter, the residue is fed back to its own input, in such way the same stage is reused many times. Cyclic converters can be arranged to have more than one stages. In this case, the residue of the last stage is fed back to the input of the first stage. Multi-stage A/D converters have a high potential for achieving high resolution and high speed, especially when pipelined, without excessive power consumption or complexity. On the other hand, cyclic A/D converters have much smaller size and power consumption at the cost of speed, compared with the multi-stage converters. Therefore, both the multi-stage and cyclic types are extremely useful types of A/D converters.

In prior art multi-stage and cyclic A/D converters, each stage typically comprises a low resolution flash A/D converter, an array of capacitors, an operational amplifier, and MOS (metal-oxide-semiconductor) switches. The capacitor array consists of a plurality of substantially equal size capacitors, one of which is designated as a feedback capacitor. In multi-stage A/D converters employing so-called digital error correction, the feedback capacitor is twice the size of other capacitors. The feedback capacitor provides a feedback path for the operational amplifier. An example of such kind of a multi-stage A/D converter is described in Lewis et. al., "A Pipelined 5-Msamples/s 9-bit Analog-to-Digital Converter," IEEE Journal of Solid-State Circuits, vol. SC-22, pp 954–961, Dec. 1987. Examples of cyclic A/D converters are described in "An Algorithmic Analog-to-Digital Converter," IEEE International Solid-State Circuits Conference Digest of Technical Papers (1977), pp 96–97. A two-stage cyclic A/D converter is disclosed in U.S. Pat. Nos. 4,760,376 and No. 5,212,486. In prior art multi-stage and cyclic A/D converters, the overall accuracy is determined by the ratio accuracy among capacitors in the array. Problems arise because integrated circuit fabrication does not provide the precision in capacitor ratios required for high-resolution A/D converters. It is difficult to achieve resolutions beyond 8 to 10 bit levels without excessive differential non-linearity (DNL) and integral non-linearity (INL).

There have been several approaches improving the accuracy of multi-stage and cyclic A/D converters beyond the level the capacitor ratio accuracy can provide. Selfcalibration techniques are disclosed in U.S. Pat. Nos. 4,903,026, 5,012,247, 5,027,116, and 5,047,772. The main disadvantage of self-calibration techniques is that circuitry necessary for self-calibration is typically very complex and adds significantly to the cost of the A/D converter. In U.S. Pat. 4,622,536, the reference refreshing technique improves accuracy without self-calibration. The disadvantages include complexity and greatly reduced conversion rate. A dual residue technique is disclosed in U.S. Pat. No. 5,120,537, which attempts to improve differential linearity by employing two signal paths in each stage. The dual residue technique is increases the complexity and the power consumption by approximately a factor of two. The ratio-independent technique, error-averaging technique, and the RSD technique are applicable only to 1 bit/stage implementation of multi-stage or cyclic A/D converters. The ratio-independent technique is very slow, the conversion rate being less than one-third of a similar design without the ratio-independent technique. The error averaging technique reduces the conversion rate by 33%, and increases the complexity and power dissipation approximately by a factor of two. The RSD technique is applicable only to cyclic A/D converters, hence very slow.

SUMMARY OF THE INVENTION

It is an object of the invention to provide an analog-to-digital converter with high resolution, high speed, low power consumption, and low complexity, that is implementable in a low cost integrated circuit fabrication technology.

It is another object of the invention to provide much higher differential linearity in multi-stage and cyclic A/D converters than what is achievable from capacitor ratio accuracies.

In all prior art multi-stage and cyclic A/D converters, the feedback network configuration in each stage is independent of the input voltage to that stage. Although some of the prior art A/D converters swap the feedback capacitor during the conversion, it is done independent of the input voltage. In an A/D converter stage embodying the present invention, the feedback network configuration is dependent on the input voltage to that stage. In a preferred embodiment employing an array of capacitors, each of the capacitors in the array is sequentially selected as the feedback capacitor as the input voltage increases. This is the most important distinguishing feature of the present invention, and is the feature that vastly improves the differential linearity of the resulting A/D converter. For practical reasons, it generally is only necessary to embody the present invention in the first several stages, remaining stages being of a conventional design.

Although the invention here is described for an A/D converter with single-ended input voltage ranging from GND to VREF the fully-differential implementation and/or the accommodation of different input voltage range is obvious to those skilled in the art, and hence is not further discussed here.

Detailed Description of Preferred Embodiments

Figure 1:
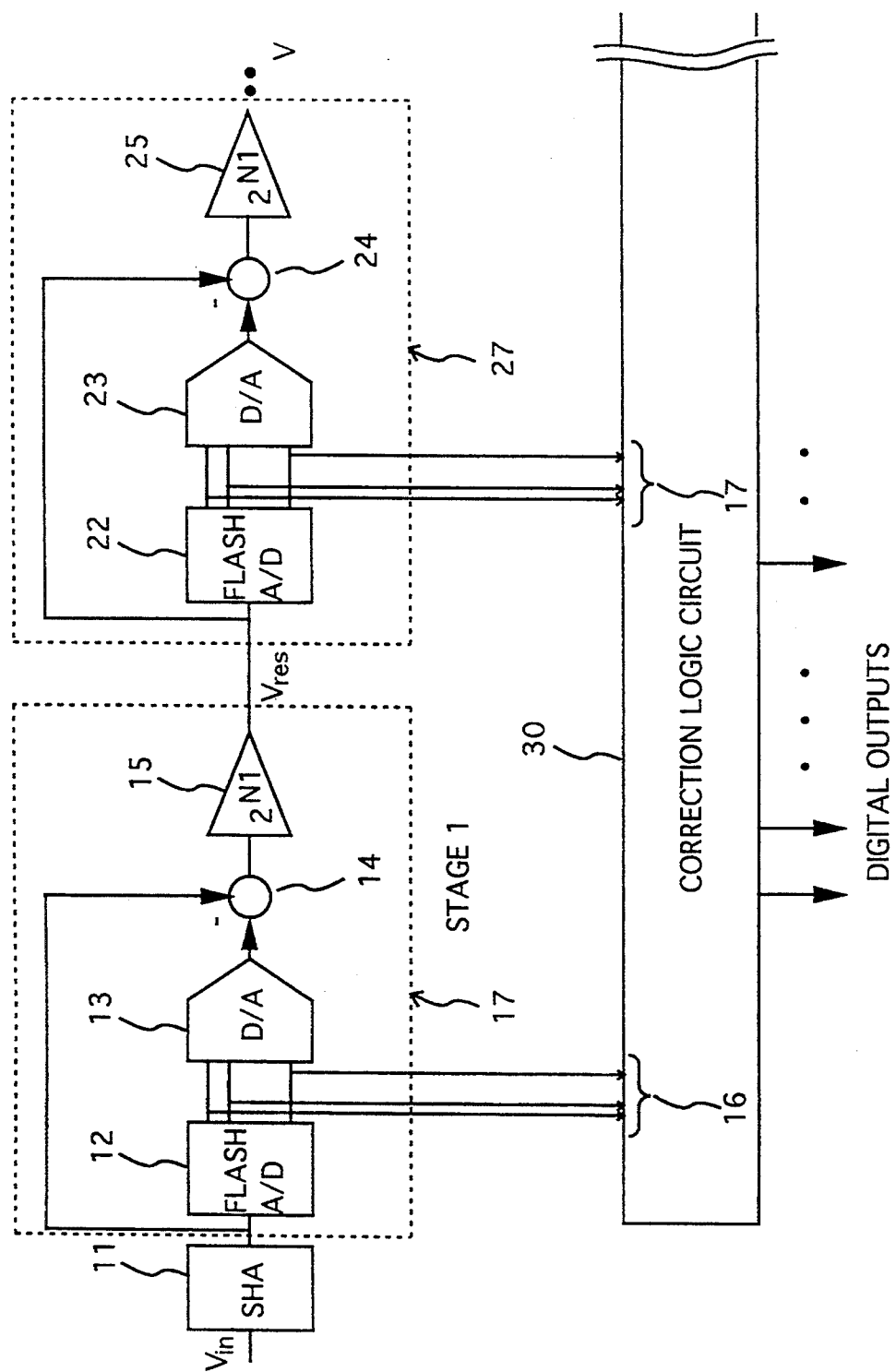
FIG. 1 Block Diagram of a Prior Art Multi-stage Analog-to-Digital Converter

Before describing preferred embodiments, an explanation of prior art multi-stage A/D converter is given. Referring to, FIG. 1, an input sample-and-hold amplifier (SHA) 11 samples the analog input voltage $v_{in}$. SHA 11 is followed by a first stage 17 consisting of a flash A/D converter 12, a D/A converter 13, a subtraction circuit 14, and an interstage amplifier 15. Flash A/D converter 13, D/A converter 14 both have N1 bit resolution and interstage amplifier 15 has a gain of $2^{N1}$ so that original full-scale of the input is restored at the output of amplifier 15. The residue output $V_{res}$ of amplifier 15 is connected to the input of a second stage 27 consisting of a flash A/D converter 22, a D/A converter 23, a subtraction circuit 24, and an interstage amplifier 25. Flash A/D converter 22, D/A converter 23 both have N2 bit resolution and interstage amplifier 25 has a gain of $2^{N2}$. Digital outputs 16 of first stage 17, and digital outputs 26 of second stage 27, and similar digital outputs of the subsequent stages are combined in a correction logic 30 to produce desired digital outputs. More stages can be cascaded to increase the resolution further, or the output of the last stage can be fed back to the input of the first stage for a cyclic operation. Often, the stages are operated in a "pipeline" fashon. The "pipeline" operation is defined as two adjacent states having the opposite clock phases. For example, during the phase in which the first stage is sampling, the second stage is amplifying in the pipeline operation.

The First Embodiment

Figure 2:
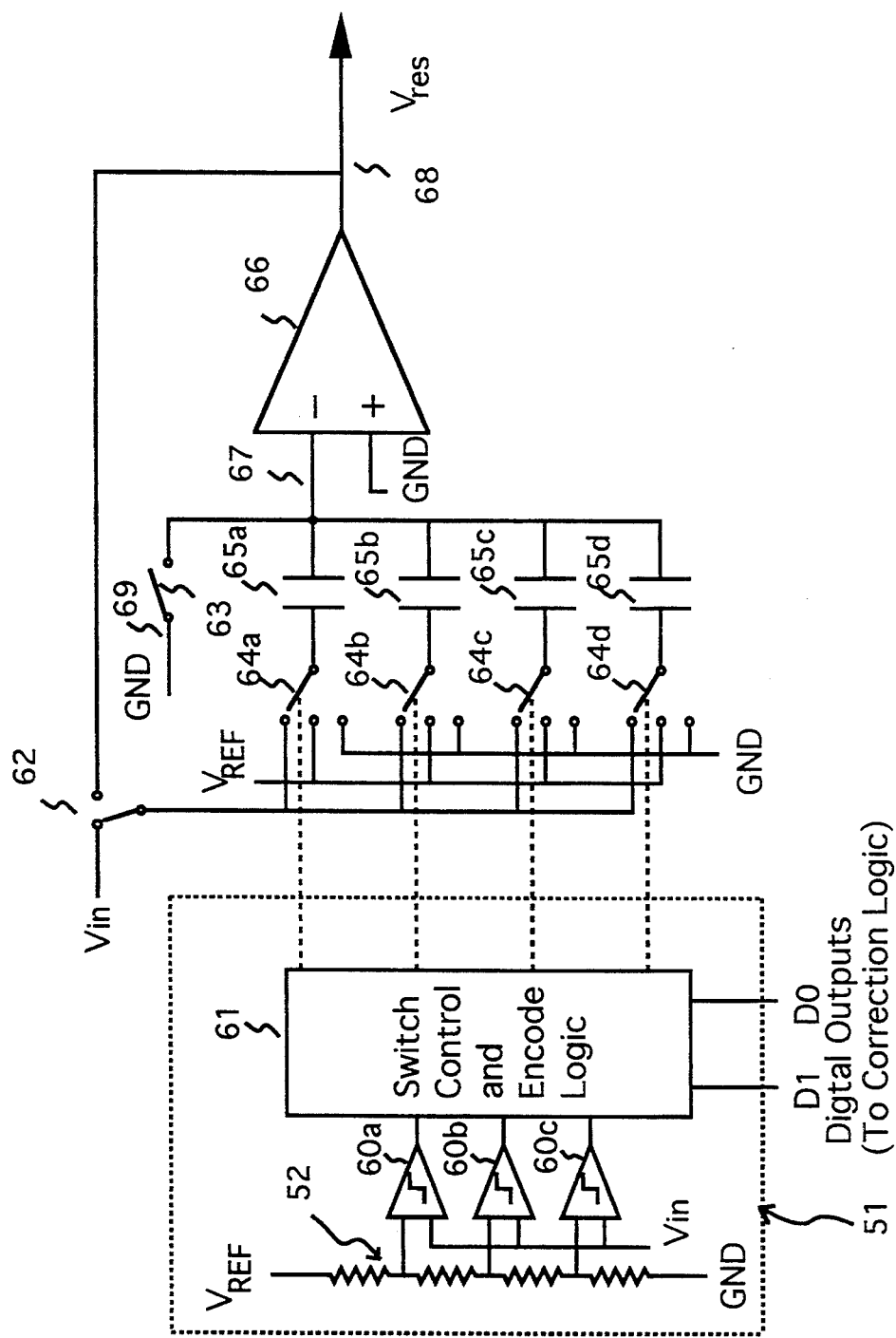
FIG. 2 Schematic Diagram of a Single Stage of the First Embodiment

FIG. 2 shows elements of a single stage of the A/D converter in accordance to the present invention. For clarity of explanation, a 2-bit stage is shown (N1=2), although any number of bits can be chosen in principle including a 1-bit per stage implementation. Although a single-ended configuration is shown for simplicity of the illustration, the invention is not limited to a single-ended implementation. The extension of the invention to a fully-differential configuration is straightforward for those skilled in the art, and will not be discussed here. The input voltage vin to the single stage of FIG. 2 is compared with three comparators 60a, 60b, and 60c. A switch control and an encode logic 61 converts the output of the three comparators into a 2-bit digital output ($D_1D_0$). A resistor string 52 having four substantially equal valued resistors is connected between the reference $$\frac{3V_{REF}}{4}, \frac{V_{REF}}{2}, \frac{V_{REF}}{4}.$$

One input of each of voltage comparators 60a, 60b, and 60c is connected to each of the top voltages $$\frac{3V_{REF}}{4}, \frac{V_{REF}}{2}, \frac{V_{REF}}{4},$$

respectively, and other inputs of the comparators 60a, 60b, and 60c are connected together to the input voltage vin. Resistor string 52, comparators 60a, 60b, 60c, and an encode logic 61 provide the function of a 2-bit flash A/D converter 51. Capacitors 65a, 65b, 65c, and 65d form a capacitor array. A 'capacitor array' is defined herein as a structure consisting of two or more capacitors, and a 'member' is defined herein as any one of the capacitors. MOS switches 62, 63, 64a, 64b, 64c, 64d, capacitors 65a, 65b, 65c, and 65d, and an operational amplifier 66 together provide the combined function of a D/A converter, a subtraction amplifier, and an interstage amplifier of a single stage. Preferably, capacitors 65a, 65b, 65c, and 65d have substantially equal values. The right plates of capacitors 65a, 65b, 65c, and 65d are connected together to node 67, where the inverting input of operational amplifier 66 is also connected. MOS switch 62 selects either the input voltage vin or an output node 68 of operational amplifier 66. MOS switches 64a, 64b, 64c, and 64d are three-position switches, selectively connecting the left plates of capacitors 65a, 65b, 65c, and 65d to switch 62, the reference voltage VREF, or the ground GND. Switch 63 connects node 67 to ground when closed. The positions of MOS switches 62, 63, 64a, 64b, 64c, and 64d are controlled by switch control logic 61.

The operation of the stage is performed in two phases. During the first phase, switch 62 is thrown to vin, switch 69 to GND, and switches 64a, 64b, 64c, and 64d to the top position, sampling charge representing the input voltage vin on capacitors 65a, 65b, 65c, and 65d. Also, comparators 60a 60b, and 60c compare the input voltage vin with the tap voltages $$\frac{3V_{REF}}{4}, \frac{V_{REF}}{2}, \frac{V_{REF}}{4}$$

respectively. The outputs of comparators 60a, 60b, and 60c are processed by logic circuit 61 to give the two-bit digital output code ($D_0D_1$). At the end of the first phase, switch 63 is turned off to hold the charge in capacitors 65a, 65b, 65c, and 65d. During the second phase, switch 62 is thrown to node 68. The positions of switches 64a, 64b, 64c, and 64d are controlled by logic circuit 61, and are determined by the outputs of the comparators from the first phase. The positions of switches 64a, 64b, 64c, and 64d are summarized in the following table.

| Input Voltage Range $v_{in}$ | Comparator Output (1st Phase) 60a | 60b | 60c | Digital Output ($D_1D_0$) | Switch Positions* (2nd Phase) 64a | 64b | 64c | 64d |
|---|---|---|---|---|---|---|---|---|
| $0 < v_{in} < \frac{V_{REF}}{4}$ | 0 | 0 | 0 | (00) | B | B | B | T |
| $\frac{V_{REF}}{4} < v_{in} < \frac{V_{REF}}{2}$ | 0 | 0 | 1 | (01) | B | B | T | M |
| $\frac{V_{REF}}{2} < v_{in} < \frac{3V_{REF}}{4}$ | 0 | 1 | 1 | (10) | B | T | M | M |
| $\frac{3V_{REF}}{4} < v_{in} < V_{REF}$ | 1 | 1 | 1 | (11) | T | M | M | M |

*Note:
T = top, M = Middle, B = Bottom.

As can be seen from the above table, switches 64a, 64b, 64c, 64d, and 62 selectively connect capacitors 65a, 65b, 65c, and 65d to node 68, the reference voltage $V_{REF}$, or the ground voltage GND in the second phase. For example, if the position of switch 64a is T (top) with switch 63 thrown to the right, the left plate of capacitor 65a is connected to node 68. In this case, capacitor 65a is connected between the output (node 68) and the inverting input (node 67) of operational amplifier 66, providing the feedback. As illustrated in the above table, one of capacitors 65a, 65b, 65c, and 65d is sequentially selected as a feedback capacitor as the input voltage vin increases. This is one of the most important feature that distinguishes the present invention from the prior art where the feedback configuration is independent of the input voltage vin.

Figure 3:
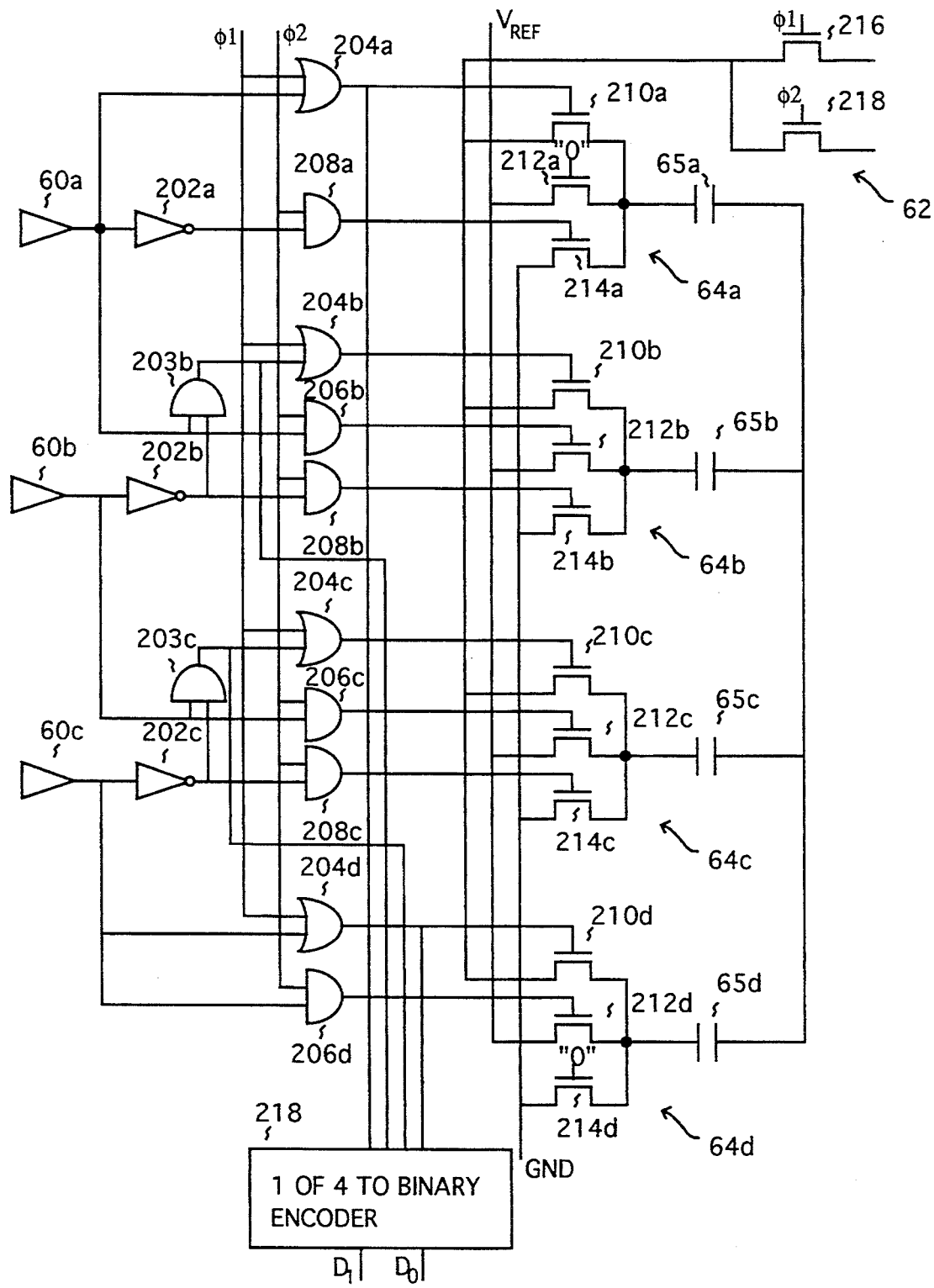
FIG. 3 Detailed Circuit for Switch Control and Encode Logic

An example of a detailed design for control logic 61 is shown in FIG. 3. Switch 65a is made up of MOS transistors 210a, 212a, and 214a, switch 65b is made up of MOS transistors 210b, 212b, and 214b, switch 65c is made up of MOS transistors 210c, 212c, and 214c, and switch 65d is made up of MOS transistors 210d, 212d, and 214d. Switch 62 has two MOS transistors 216 and 21. Switches 64a through 64d are connected to capacitors 65a through 65d as shown. The signal $\phi1$ is the first phase clock, and the signal $\phi2$ is the second phase clock signal. Logic gates 202a through 202c, 203b, 203c, 204a through 204d, 206b through 206d, and 208a through 208d convert the outputs of comparators 60a through 60c to digital signals controlling switches 64a through 64d. A two-bit digital output (D1D0) is produced by a 1 of 4 to binary encoder 218.

Figure 4:
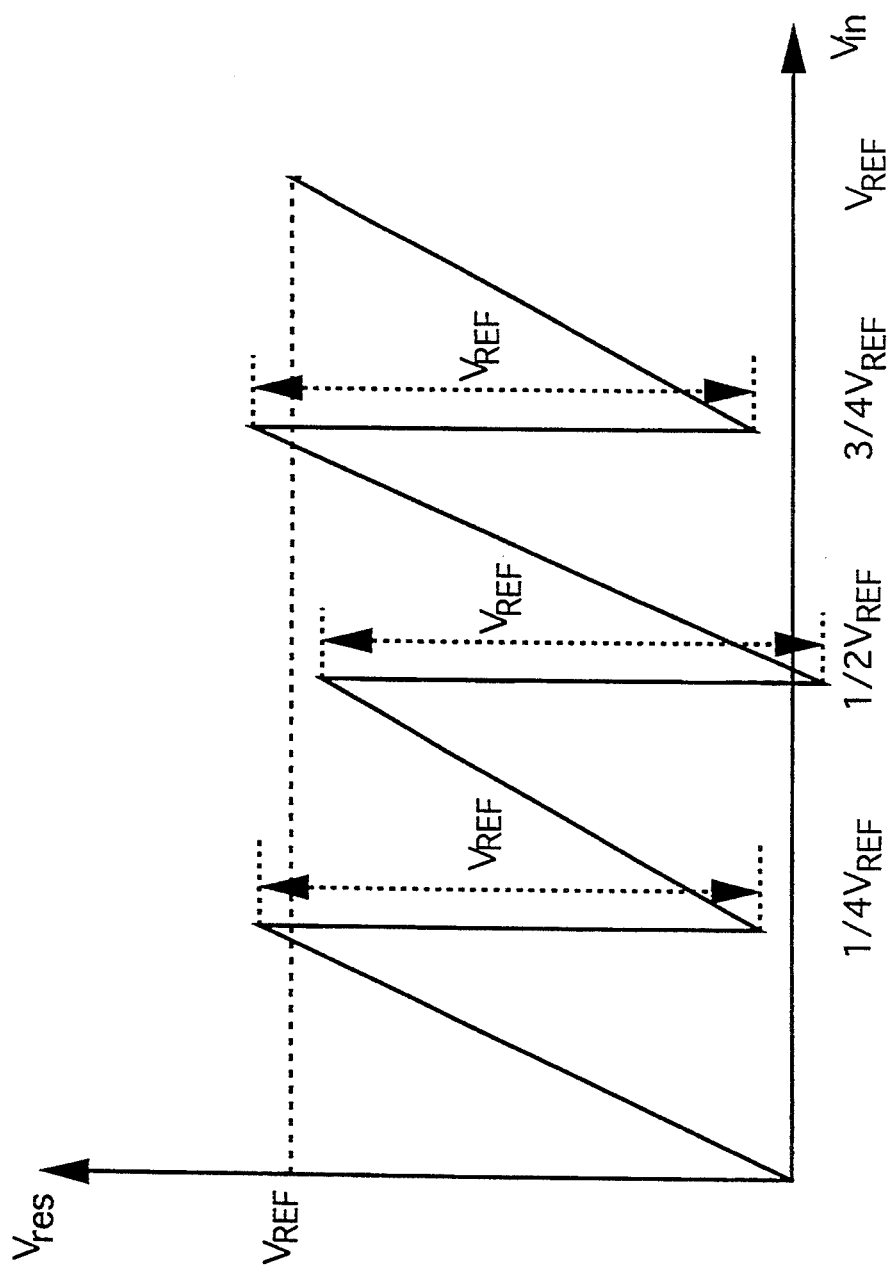
FIG. 4 Residue Plot of a Converter Stage with Capacitor Mismatches

In practice, the values of capacitors 65a, 65b, 65c, and 65d may not be identical due to processing variations. According to the present invention, the mismatches in capacitors 65a, 65b, 65c, and 65d do not contribute differential non-linearity (DNL) if flash A/D converter 51 is perfectly accurate. To examine this, consider the residue voltage Vres at node 68. The residue voltage vs. the input voltage plot is shown in FIG. 4. Despite mismatches in capacitors 65a, 65b, 65c, and 65d, it can be shown that the residue drops precisely by the full-scale voltage $V_{REF}$ for any increase of digit code by one. To prove this, consider the case when the input voltage is near.

$$\frac{V_{REF}}{4}.$$

At this input voltage, the output of comparator 60c is either 0 giving a digital output code of (00) or 1 giving a digital output code of (01). The residue drop corresponding to this code transition can be calculated by the well known charge conservation principle. The sampled charge $Q_1$ on node 67 during the first phase is:

$$Q_1 = -(C_1 + C_2 + C_3 + C_4)\frac{V_{REF}}{4} \quad (1)$$

where $C_1$, $C_2$, $C_3$, and $C_4$ are the capacitance of capacitors 64a, 64b, 64c, and 64d, respectively. Taking the variation of $C_1$ through $C_4$ from their nominal value of C into account, we can write:

$C_1 = (1+\epsilon_1)C$
$C_2 = (1+\epsilon_2)C$
$C_3 = (1+\epsilon_3)C$
$C_4 = (1+\epsilon_4)C$ where $\epsilon_1$, $\epsilon_2$, $\epsilon_3$, and $\epsilon_4$ represent ratio deviations of $C_1$, $C_2$, $C_3$ and $C_4$ from their nominal value C, respectively.

From Equation (1) it is clear that $$Q_1 = -(4 + \epsilon_1 + \epsilon_2 + \epsilon_3 + \epsilon_4)C\frac{V_{REF}}{4} \quad (2)$$

During the second phase, if the output of comparator 60c is 0, from the previous table, we can see that the left plate of capacitor 64d is connected to node 68 while the left plates of other capacitors are grounded. In this configuration, the total charge $Q_2$ at node 67 is then:

$$Q_2 = -(1+\epsilon_4)CV_{res} \quad (3)$$

where $V_{res}$ is the voltage at node 68, and thus is the residue output with the outputs of comparators 60a, 60b, and 60c of 0. Since charge is conserved between the two phases, $Q_1 = Q_2$. Thus, from Equations (2) and (3) we can solve for Vres, the residue output with the outputs of comparators 60a, 60b, and 60c of 0:

$$V_{res} = \frac{1 + \frac{\epsilon_1 + \epsilon_2 + \epsilon_3 + \epsilon_4}{4}}{1 + \epsilon_4} V_{REF} \quad (4)$$

$$\approx \left(1 + \frac{\epsilon_1 + \epsilon_2 + \epsilon_3 + \epsilon_4}{4} - \epsilon_4\right)V_{REF}$$

The residue voltage $V_{res}'$ with the outputs of comparators 60a and 60b of 0 and that of comparator 60c of 1 can be computed in a similar manner, keeping track of how capacitors are connected from the previous table. In this configuration, the total charge $Q_2'$ at node 67:

$$Q_2' = -(1+\epsilon_4)V_{REF} - (1+\epsilon_3)V_{res}' \quad (5)$$

where $V_{res}'$ is the new residue voltage in this configuration. Again, from charge conservation, $Q_1 = Q_2'$ resulting:

$$V_{res}' = \frac{\frac{\epsilon_1 + \epsilon_2 + \epsilon_3 + \epsilon_4}{4} - \epsilon_4}{1 + \epsilon_3} V_{REF} \quad (6)$$

$$\approx \left(\frac{\epsilon_1 + \epsilon_2 + \epsilon_3 + \epsilon_4}{4} - \epsilon_4\right)(1-\epsilon_3)V_{REF}$$

Since $\epsilon_1$, $\epsilon_2$, $\epsilon_3$, and $\epsilon_4$ represent small ratio deviations, the product terms in Equation (6) are very small, and can be ignored resulting:

$$V_{res}' \approx \left(\frac{\epsilon_1 + \epsilon_2 + \epsilon_3 + \epsilon_4}{4} - \epsilon_4\right) V_{REF} \quad (7)$$

From Equations (4) and (7), the residue drop $V_{res} - V_{res}'$ for the code transition corresponding to (00) to (01) is:

$$V_{res} - V_{res}' \approx V_{REF} \quad (8)$$

Thus, despite finite deviations of capacitors 64a, 64b, 64c, and 64d from the nominal value, the residue drop corresponds almost exactly the reference voltage $V_{REF}$. It is straightforward to demonstrate that residue drops corresponding to other code transitions are $V_{REF}$.

In practical multi-stage A/D converters, it generally is only necessary to employ the preferred embodiment of the invention in the first one or several stages. Subsequent stages can utilize conventional design with a digital error correction, detailed design example of which can be found in Lewis et. al., "A Pipelined 5-Msamples/s 9-bit Analog-to-Digital Converter," IEEE Journal of Solid-State Circuits, vol. SC-22, 954–961, Dec. 1987. The overall A/D converter characteristic will be monotonic despite capacitor value deviations. The deviations of values of capacitors 64a, 64b, 64c, and 64d cause only integral nonlinearity which is well tolerated in many applications.

The preceding analysis assumed that flash A/D converter 51 is perfectly accurate. For this will not be the case in practice, we must consider the effect of the inaccuracies in flash A/D converter 51. In general, it can be shown that the overall A/D converter will have DNL within $\pm\frac{1}{2}$LSB(least significant bit) if the following requirement is met in the first stage.

$$\text{for all } i = 1, 2, \ldots, 2^{N1} - 1, \ |\epsilon_i - \epsilon_{i+1}| < \frac{1}{2^{N-M+1}} \quad (9)$$

where N is the resolution of the whole A/D converter, N1 the resolution of the first stage, and M the accuracy of flash A/D converter 51 in the first stage in number of bits, and $\epsilon_i$ the ratio deviations of the i-th capacitor in the first stage. Unlike in a conventional multi-stage converter, the accuracy requirement is much more relaxed. For example, according to Equation (9), for N=12 and assuming a 6-bit accurate flash converter (M=6), the accuracy in capacitor ratios needs to be only 6 bits good. This is a vast improvement from a conventional multi-stage A/D converter typically requiring 9 bits or higher capacitor matching.

The Second Embodiment

Figure 5:
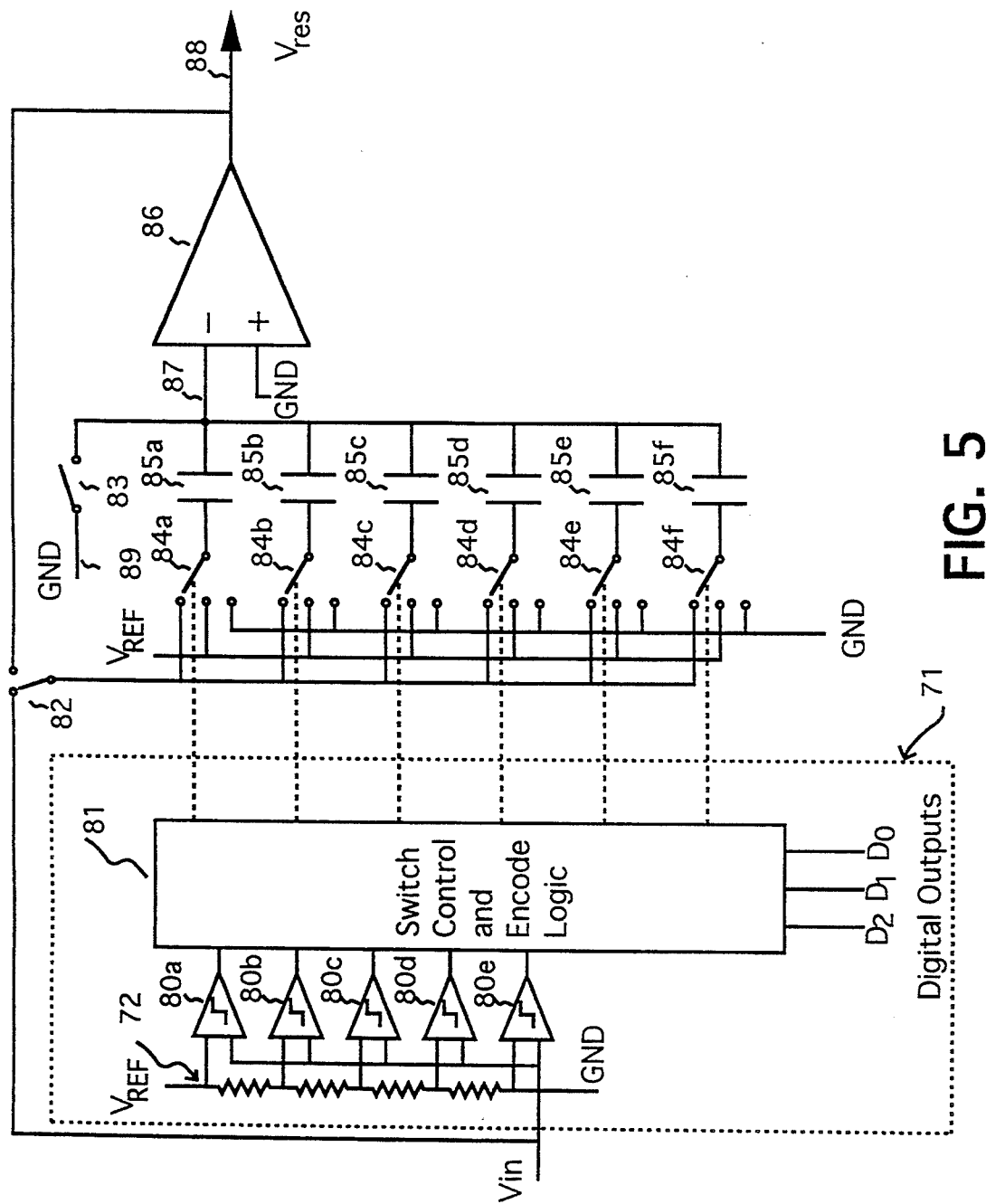
FIG. 5 Schematic Diagram of a Single Stage of the Second Embodiment

In multi-stage and cyclic A/D converters, a digital error-correction capability is often desired. Digital error-correction is a simple digital operation which adds the digital outputs of two adjacent stages with one bit overlap. Digital error correction corrects for comparator error. The second embodiment according to the present invention incorporates digital error correction and over-range capability while precisely maintaining the input full-scale range of $V_{REF}$, and the output residue drop of $V_{REF}$ as in the first embodiment. The over-range capability extends the input voltage range beyond GND and $V_{REF}$. This is to ensure correct digitization of the residue voltage from the preceding stage which may exceed GND and $V_{REF}$ due to capacitor mismatches or comparator errors. FIG. 5 shows the elements of second embodiment of a single stage with $$\pm \frac{V_{REF}}{4}$$

over-range capability. Again, for simplicity, a single stage with a 2 bit resolution plus $$\pm \frac{V_{REF}}{4}$$

over-range is shown. It is straightforward to increase the extent of the over-range by adding mode resistors and comparators. A flash A/D converter 71 consists of a resistor string 72 and comparators 80a, 80b, 80c, 80d, and 80e. Compared with the first embodiment in FIG. 2 where only three comparators 60a, 60b, and 60c are employed, a total of 5 comparators 80a, 80b, 80c, 80d, and 80e are included to offer $$\pm \frac{V_{REF}}{4}$$

over-range capability. Wider over-range can be provided, in principle, by adding more resistors and comparators, and connecting them to voltages higher than VREF and lower than GND. A switch control logic 81 controls the position of switches 84a, 84b, 84c, 84d, 84e, 84f, and 82, which in turn connect the left plates of capacitors 85a, 85b, 85c, 85d, 85e, and 85f to the input voltage vin, the reference voltage VREF, the ground potential GND, or a node 88. Control logic 81 also controls the position of switches 82 and 83. The operation of the stage shown is similar to the first embodiment. During the first phase (sampling) phase, the input voltage to this stage vin is connected to the left plates of capacitors 85b, 85c, 85d, and 85e through switches 84b, 84c, 84d, 84e, and 82. The left plate of capacitor 85a is connected to $V_{REF}$ through switch 84a, and the left plate of capacitor 85f is connected to GND through switch 84f. The right plates of capacitors 85a, 85b, 85c, 85d, 85e, and 85f are connected to a node 87, and to GND through switch 83. During the second phase (amplifying phase), switch 83 is opened, switch 82 is thrown to node 88, and switches 84a, 84b, 84c, 84d, 84e, and 84f take the positions shown in the following table.

| Stage Input Voltage Range | Comparator Output (1st Phase) | | | | | Digital Output | Switch Positions (2nd Phase) | | | | | |
|---|---|---|---|---|---|---|---|---|---|---|---|---|
| $v_{in}$ | 80a | 80b | 80c | 80d | 80e | $(D_2 D_1 D_0)$ | 84a | 84b | 84c | 84d | 84e | 84f |
| $v_{in} < 0$ | 0 | 0 | 0 | 0 | 0 | (−001) | B | B | B | B | B | T |
| $0 < v_{in} < \frac{V_{REF}}{4}$ | 0 | 0 | 0 | 0 | 1 | (000) | B | B | B | B | T | M |
| $\frac{V_{REF}}{4} < v_{in} < \frac{V_{REF}}{2}$ | 0 | 0 | 0 | 1 | 1 | (001) | B | B | B | T | M | M |
| $\frac{V_{REF}}{2} < v_{in} < \frac{3V_{REF}}{4}$ | 0 | 0 | 1 | 1 | 1 | (010) | B | B | T | M | M | M |
| $\frac{3V_{REF}}{4} < v_{in} < V_{REF}$ | 0 | 1 | 1 | 1 | 1 | (011) | B | T | M | M | M | M |
| $v_{in} > V_{REF}$ | 1 | 1 | 1 | 1 | 1 | (100) | T | M | M | M | M | M |

A three-bit digital output $(D_2 D_1 D_0)$ is obtained from control logic 81. Employing a similar analysis to that for the first stage, it can be shown that the residue drop from the peak to the bottom value is $V_{REF}$, and that the full-scale of this stage is precisely VREF with $\pm \frac{1}{4} V_{REF}$ over-range.

It should be noted that the extension of the technique described here to any number of bits per stage is straightforward, although only a 2 bit per stage example is discussed for simplicity. Also, a fully differential implementation of the present invention is straight forward for those skilled in the art.

The correction logic for implementing digital error correction is functionally a digital adder which adds digital outputs of stages with a one-bit overlap between two stages where error-correction is employed. The detailed design of such digital error correction circuit is described in Lewis et. al., "A Pipelined 5-Msamples/s 9-bit Analog-to-Digital Converter," IEEE Journal of Solid-State Circuits, vol. SC-22pp 954–961, Dec. 1987.

The Third Embodiment

Figure 6:
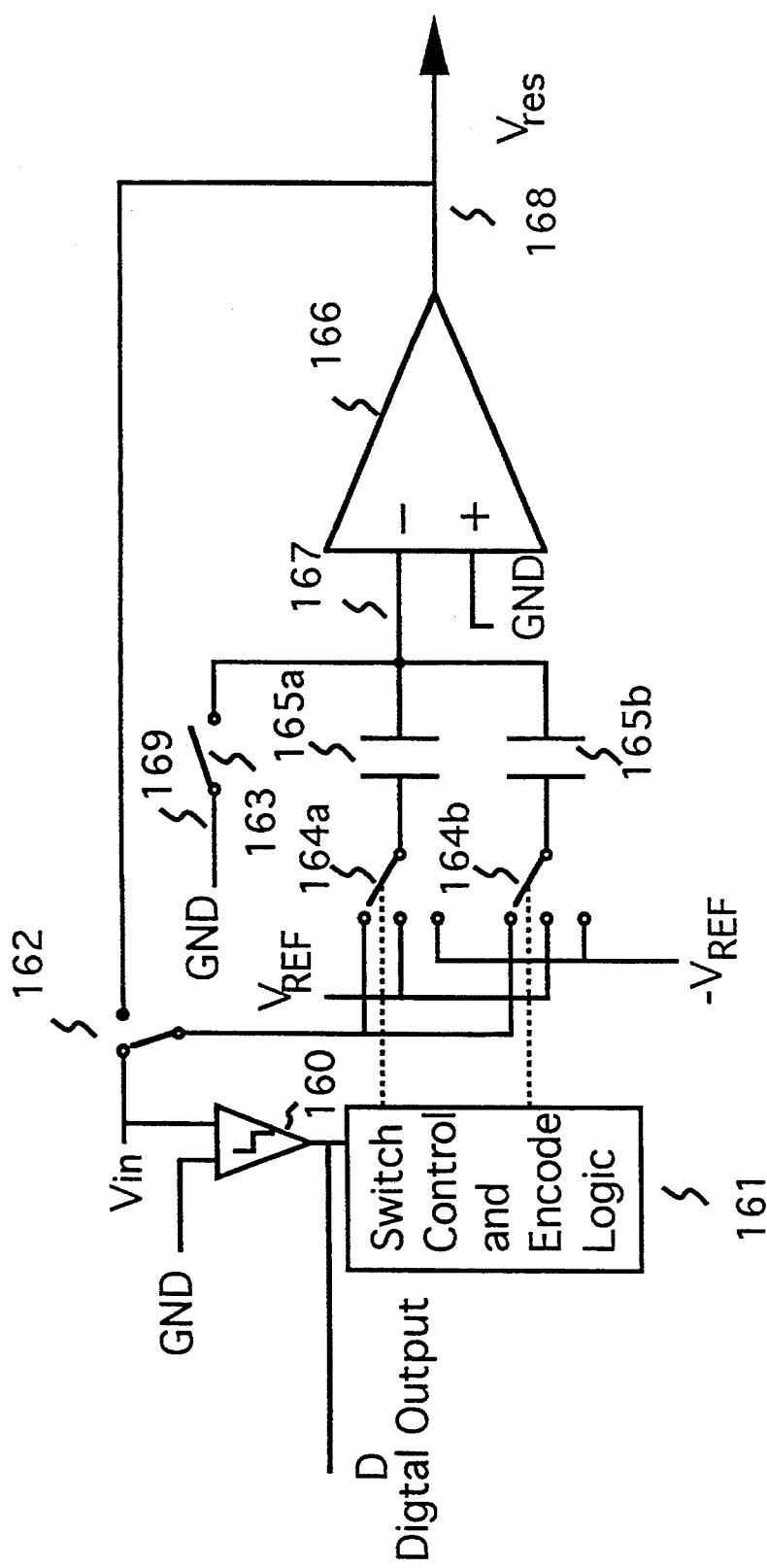
FIG. 6 Schematic Diagram of a Single Stage of the Third Embodiment

The third embodiment is identical to the first embodiment in the operating principle, but shown here as a separate embodiment to illustrate a 1-bit per stage design with two reference voltages $V_{REF}$ and $-V_{REF}$. FIG. 6 shows a single stage of the third embodiment. A voltage comparator 160 compares the first stage input voltage $v_{in}$ with GND, resulting in a digital output code D. MOS switches 162, 163, 164a, and 164b, capacitors 165a and 165b, and an operational amplifier 166 together provide the combined function corresponding to a D/A converter, a subtraction amplifier, and an interstage amplifier. The fight plates of capacitors 165a and 165b are connected together to a node 167, where the inverting input of operational amplifier 166 is also connected. MOS switch 162 selects either the input voltage $v_{in}$ or an output node 168 of operational amplifier 166. MOS switches 164a and 164b are three-position switches, selectively connecting the left plates of capacitors 165a and 165b to switch 162, the reference voltage VREF, or the ground GND. Switch 163 connects node 167 to ground when closed. The positions of MOS switches 162, 163, 164a, and 164b are controlled by a switch control logic 161.

The operation of the stage is performed in two phases. During the first phase, switch 162 is thrown to $v_{in}$, switch 163 to GND, and switches 164a and 164b to the top position, sampling charge corresponding to the input voltage $v_{in}$ on capacitors 165a and 165b. Also, comparator 160 compares the input voltage $v_{in}$ with GND. The output of comparator 160 gives the digital output code D. At the end of the first phase, switch 163 is turned off to hold the charge in capacitors 165a and 165b. During the second phase, switch 162 is thrown to node 168. The positions of switches 164a and 164b are controlled by control logic circuit 161, and are determined by the output of the comparator from the first phase. The switch positions are summarized in the following table

| Input Voltage Range | Comparator Output | Digital Output | Switch Positions (2nd Phase) | |
|---|---|---|---|---|
| $v_{in}$ | (1st Phase) | D | 64a | 64b |
| $v_{in} < 0$ | 0 | 0 | B | T |
| $0 < v_{in}$ | 1 | 1 | T | M |

The Fourth Embodiment

Figure 7:
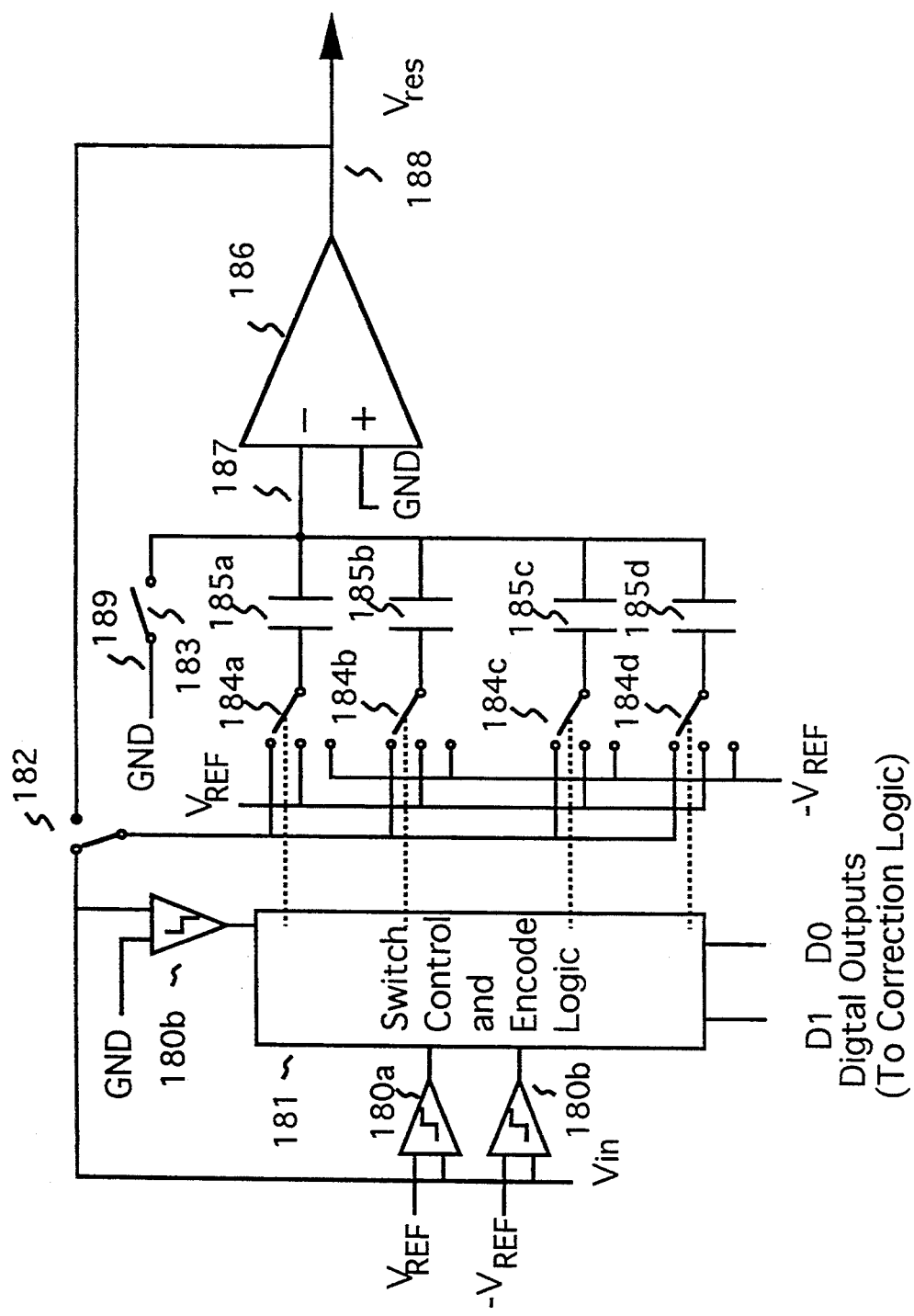
FIG. 7 Schematic Diagram of a Single Stage of the Fourth Embodiment

The fourth embodiment is similar to the second embodiment but, has 1 bit resolution plus $\pm V_{REF}$ over-range and error-correction. Two reference voltages $V_{REF}$ and $-V_{REF}$ are employed. Referring to FIG. 7, comparators 180a, 180b, and 180c compare the input voltage $v_{in}$ with $V_{REF}$, GND, and $-V_{REF}$, respectively. A switch control logic 181 controls the position of switches 184a, 184b, 184c, and 184d, which in turn selectively connect the left plates of capacitors 185a, 185b, 185c, and 185d to the input voltage $v_{in}$, the reference voltage $V_{REF}$, the ground potential GND, or a switch 182. Control logic 181 also controls the position of switches 182 and 183. During the first phase (sampling) phase, the input voltage to this stage vin is connected to the left plates of capacitors 185b and 185c through switches 184b, 184c, and 182. The left plate of capacitor 185a is connected to VREF through switch 184a, and the left plate of capacitor 185d is connected to $-V_{REF}$ through switch 184d. The fight plates of capacitors 185a, 185b, 185c, and 185d are connected to a node 187, and to GND through switch 183. During the second phase (amplifying phase), switch. 183 is opened, switch 182 is thrown to a node 188, and switches 184a, 184b, 184c, and 184d take the positions shown in the following table. A two-bit digital output $(D_1 D_0)$ is obtained from control logic 181. The digital correction logic is functionally identical to the one in the second embodiment.

| Stage Input Voltage Range $v_{in}$ | Comparator Output (1st Phase) | | | Digital Output ($D_1D_0$) | Switch Positions (2nd Phase) | | | |
|---|---|---|---|---|---|---|---|---|
| | 180a | 180b | 180c | | 184a | 184b | 184c | 184d |
| $v_{in} < -V_{REF}$ | 0 | 0 | 0 | (−01) | B | B | B | T |
| $-V_{REF} < v_{in} < 0$ | 0 | 0 | 1 | (00) | B | B | T | M |
| $0 < v_{in} < V_{REF}$ | 0 | 1 | 1 | (01) | B | T | M | M |
| $V_{REF} < v_{in}$ | 1 | 1 | 1 | (10) | T | M | M | M |

The Fifth Embodiment

This embodiment is identical to the first embodiment except node 69 is connected to node 68 instead of GND in FIG. 2, This arrangement removes offset voltages of operational amplifiers 66.

The Sixth Embodiment

This embodiment is identical to the second embodiment except node 89 is connected to node 88 instead of GND in FIG. 5, This arrangement removes offset voltages of operational amplifiers 86.

The Seventh Embodiment

This embodiment is identical to the third embodiment except offset-cancellation is employed as in the fifth embodiments.

The Eighth Embodiment

This embodiment is identical to the fourth embodiment except offset-cancellation is employed as in the sixth embodiments.

The Ninth Embodiment

This embodiment is similar to any of the above embodiments except the reference voltages for the voltage comparators are generated from ratioed capacitors instead of resistor strings 52 and 72.

Other Embodiments

Obviously, a numerous permutations of different designs of the embodiments described herein are possible, and may be preferred in some applications. An example is a four-stage converter employing the first embodiment in the first stage, the third embodiment in the second stage, and employing conventional stages for the third and the fourth stages. Also, both pipelined and non-pipelined operations are possible. Fully-differential variations of any of the above embodiments are an obvious extension of the embodiments described hereto. For certain applications, any of the embodiments described hereto with substantially unequal capacitor values may be desired for a non-linear A/D conversion.

The invention is disclosed in sufficient detail so that one skilled in the art will be able to understand the circuits and their operation to be able to reproduce the results of the inventor without undue experimentation. Nevertheless, the circuit details for common electronic circuits such as operational amplifiers are omitted to avoid obscuring the invention in unnecessary detail. Circuit details for digital circuits including the switch control circuit, digital correction circuit, are also omitted, for the same reason, and one skilled in the art will be able to produce such digital circuits without undue experimentation. It will be clear to one skilled in the art that other embodiments incorporating the principles of the present invention are possible. The above disclosure is merely illustrative and not intended to be limiting in any respect.

I claim:

1. An analog-to-digital converter assembly comprising:
    analog input means for providing an analog input signal to the assembly,
    first reference and second reference terminal means for providing a first and a second reference signal to the assembly,
    amplifying means having at least one input terminal and at least one output terminal for receiving a signal from the input terminal and producing an amplified signal at the output terminal,
    a plurality of capacitors each with a first and a second side having the first side connected together to the input terminal of said amplifying means,
    charge sample means connected to said analog input means for sampling charge substantially representative of the analog input signal in at least one of said capacitors,
    switch means for providing selective electrical connection and disconnection of each second side of said capacitors to the first reference terminal, the second reference terminal, and the output terminal of said amplifying means, and
    control means for enabling said switch means to provide selective electrical connection of the second side of at least one different member of said capacitors to the output terminal of said amplifying means for each different range of the analog input signal.

2. The assembly of claim 1, wherein said capacitors have substantially equal value, and said control means enable said switch means to provide selective electrical connection of the second side of a single different member of said capacitors sequentially for each range of increasing analog input signal, to the output terminal of said amplifying means.

3. The assembly as claimed in claim 1, wherein said charge sample means comprise a means for electrically connecting and disconnecting said analog input means to the second side of at least one of said capacitors.

4. The assembly as claimed in claim 2, wherein said charge sample means further include means for electrically connecting and disconnecting the input and the output terminals of said amplifying means.

5. The assembly as claimed in claim 3, further including third reference terminal means for providing the third reference signal to the assembly.

6. The assembly as claimed in claim 5, wherein said charge sample means further include means for electrically connecting and disconnecting the first side of said capacitors to the third reference terminal.

7. The assembly as claimed in claim 1, wherein said amplifying means is an operational amplifier.

8. The assembly as claimed in claim 1, wherein said control means comprise at least one comparator.

9. The assembly as claimed in claim 8, further including digital error correction means for combining digital output sequences to produce a corrected digital output signal.

10. An analog-to-digital converter assembly comprising:
    analog input means for providing an analog input signal to the assembly, first reference and second reference terminal means for providing a first and a second reference signal to the assembly, a plurality of stages connected in cascade, each stage comprising:

stage input means for providing input signal to said stage, amplifying means having at least one input terminal and at least one output terminal for receiving a signal from the input terminal and producing an amplified signal at the output terminal, a plurality of capacitors each with a first and a second side having the first side connected together to the input terminal of said amplifying means, charge sample means connected to said stage input means for sampling charge substantially representative of the stage input signal in at least one of said capacitors, switch means for providing selective electrical connection and disconnection of each second side of said capacitors to the first reference terminal, the second reference terminal, and the output terminal of said amplifying means, and control means for enabling said switch means to provide selective electrical connection of the second side of at least one different member of capacitors to the output terminal of said amplifying means for each different range of the stage input signal, input connection means for connecting the first stage input means to said analog input means, and means for connecting the stage input means of each succeeding stage to the output terminal of the amplifying means of the preceding stage.

11. The assembly as claimed in claim 10, wherein said control means include at least one comparator.

12. The assembly as claimed in claim 11, further including digital error correction means for combining digital outputs of pluralities of stages to produce a corrected digital output.

13. The assembly of claim 12, wherein said capacitors have substantially equal value, and said control means enable said switch means to provide selective electrical connection of the second side of a single different member of said capacitors sequentially for each range of increasing stage input signal, to the output terminal of said amplifying means.

14. The assembly as claimed in claim 12, wherein said charge sample means include means for electrically connecting and disconnecting said stage input means to the second side of at least one of said capacitors.

15. The assembly as claimed in claim 14, wherein said charge sample means further include means for electrically connecting and disconnecting the input and the output terminals of said amplifying means.

16. The assembly as claimed in claim 12, further including a third reference terminal means for providing the third reference signal to the assembly.

17. The assembly as claimed in claim 16, wherein said charge sample means further include means for electrically connecting and disconnecting the first side of said capacitors to the third reference terminal.

18. The assembly as claimed in claim 11, wherein said amplifying means is an operational amplifier.

19. The assembly as claimed in claim 10, wherein said stages are connected in pipeline configuration.

20. The assembly as claimed in claim 10, wherein said input connection means include switch means selectively connecting and disconnecting the first stage input to the analog input and to the output of the amplifying means of the last stage, whereby facilitating a cyclic operation.

* * * * *